United States Patent [19]

Stein

[11] Patent Number: 5,307,433
[45] Date of Patent: Apr. 26, 1994

[54] OPTICAL CONNECTION MEMBER OF SILICON AND METHOD FOR THE MANUFACTURE THEREOF

[75] Inventor: Karl-Ulrich Stein, Unterhaching, Fed. Rep. of Germany

[73] Assignee: Siemens Aktiengesellschaft, Munich, Fed. Rep. of Germany

[21] Appl. No.: 21,660

[22] Filed: Feb. 22, 1993

Related U.S. Application Data

[63] Continuation of Ser. No. 574,795, Aug. 30, 1990, abandoned.

[30] Foreign Application Priority Data

Sep. 29, 1989 [DE] Fed. Rep. of Germany ....... 3932654
Jun. 13, 1990 [EP] European Pat. Off. ........... 90111215

[51] Int. Cl.⁵ ................................................ G02B 6/30
[52] U.S. Cl. ........................................ 385/88; 385/91; 385/92
[58] Field of Search ............................. 385/88, 91, 92

[56] References Cited

U.S. PATENT DOCUMENTS

| | | | |
|---|---|---|---|
| 4,155,156 | 5/1979 | Assmann | 29/628 |
| 4,411,060 | 10/1983 | Cho | 148/171 |
| 4,483,062 | 11/1984 | Irikura | 29/570 |
| 4,497,105 | 2/1985 | Uemura | 29/570 |
| 4,592,619 | 6/1986 | Weidel | 350/388 |
| 4,699,453 | 10/1987 | Roberts | 350/96.20 |
| 4,762,382 | 8/1988 | Husain et al. | 350/96.11 |
| 4,767,174 | 8/1988 | Carenco et al. | 350/96.20 |
| 4,779,946 | 10/1988 | Pimpinella et al. | 385/88 |
| 4,807,238 | 2/1989 | Yokomori | 372/32 |
| 4,865,659 | 9/1989 | Shigeta et al. | 148/33 |
| 4,873,202 | 10/1989 | Akiyama | 385/14 |
| 4,875,750 | 10/1989 | Spaeth et al. | 350/96.18 |
| 4,892,374 | 1/1990 | Ackerman et al. | 350/96.11 |
| 4,916,497 | 4/1990 | Gaul et al. | 385/12 |
| 4,973,133 | 11/1990 | Matz et al. | 359/320 |

FOREIGN PATENT DOCUMENTS

| | | |
|---|---|---|
| 0136050 | 4/1985 | European Pat. Off. . |
| 0154431 | 9/1985 | European Pat. Off. . |
| 2740745 | 5/1982 | Fed. Rep. of Germany . |
| 61-117513 | 6/1986 | Japan . |
| 61-166504 | 7/1986 | Japan . |
| 63-96608 | 4/1988 | Japan . |
| 1-4710 | 1/1989 | Japan . |

OTHER PUBLICATIONS

Ernest Bassous, Fabrication of Novel Three Dimensional Microstructures by the Anisotropic Etching of (100) and (110) Silicon, IEEE Transactions on Electronic Devices; vol. ED-25, No. 10, Oct. 1978; pp. 1178–1185.
Optoelektronik Magazin, vol. 4, No. 6/7, 1988, S. 556 ff.
Keiser "Optical Fiber Communications", McGraw-Hill, p. 124, 125.
Conference Record of the 16th IEEE Photovoltaic Specialists Conference, Sep. 27, 1982, Jack P. Salerno et al. entitled: "Growth and Characterization of Oriented GaAs Bicrystal Layers", pp. 1299–1303.

Primary Examiner—Frank Gonzalez
Assistant Examiner—Stephen W. Barns
Attorney, Agent, or Firm—Hill, Steadman & Simpson

[57] ABSTRACT

A member of silicon, having at least two regions of single-crystal silicon having mutually different crystal orientations for anisotropic etching to produce advantageous profiles, and method for the manufacture thereof. In such a member of crystalline silicon, such as employed in silicon microtechnology, both adjustment aids for round and cylindrical members as well as adjustment aids for rectangular members can be fashioned using only the basis of anisotropic etching. The two regions can be defined by two wafers of differently oriented, single-crystal silicon that have their flat sides joined to one another.

10 Claims, 1 Drawing Sheet

OPTICAL CONNECTION MEMBER OF SILICON AND METHOD FOR THE MANUFACTURE THEREOF

This is a continuation of application Ser. No. 574,795, filed Aug. 30, 1990, abandoned.

BACKGROUND OF THE INVENTION

The invention relates to a member of crystalline silicon and to a method for the manufacture thereof, in particular the invention relates to a member of crystalline silicon having at least two regions of single-crystal silicon having different crystal orientations.

Single-crystal silicon that is processed by etching is a promising material for the future of micromechanics which is also referred to as microsystem technology. The applications thereof are still in the cradle. An important area of application of this technology are couplings and plugs for light waveguide components and fibers.

What is referred to as V-channel technique is thereby already currently utilized, this being produced on wafers having an orientation (100), with anisotropic etching. It is thus particularly round and cylindrical members such as spherical lenses and fibers that can be adjusted and fixed. When other adjustment and fixing aids are also to be manufactured on the wafer, this could occur on the basis of a combination of anisotropic etching with suitable isotropic etching on (100)-silicon material.

SUMMARY OF THE INVENTION

It is an object of the invention to specify a member of crystalline silicon wherein a wider variety of crystal faces or profiles can be manufactured compared to single crystal members, using only anisotropic etching. In particular, the members thus manufactured should be capable of being utilized as adjustment and fixing aids for round and cylindrical members as well as adjustment and fixing aids for rectangular members, for example chips of compound semiconductors.

The objects of the invention are inventively achieved by providing a member of crystalline silicon having at least two regions, each region comprising a single-crystal silicon having mutually different crystal orientations compared to at least an adjacent region, for anisotropic etching. The member could have at least two single-crystal silicon pieces having different crystal orientations joined to one another by various methods. Among the methods for joining are:

tempering at temperatures above 1000° C.;

joining to one another via SiO$_2$ by tempering at temperatures above 1000° C.;

joining together by a silicon-compatible glass solder;

joining together by a glass solder that is composed of phosphorous-doped SiO$_2$;

joining together with a metal solder technique;

joining together with a metal solder technique using silicon-metal eutectic;

joining together with a silicon-metal eutectic where gold is employed for the eutectic, An applied example of the invention is shown in the drawing and shall be set forth in greater detail in the following description.

DETAILED DESCRIPTION OF THE PREFERRED EMBODIMENTS

Figure 1:
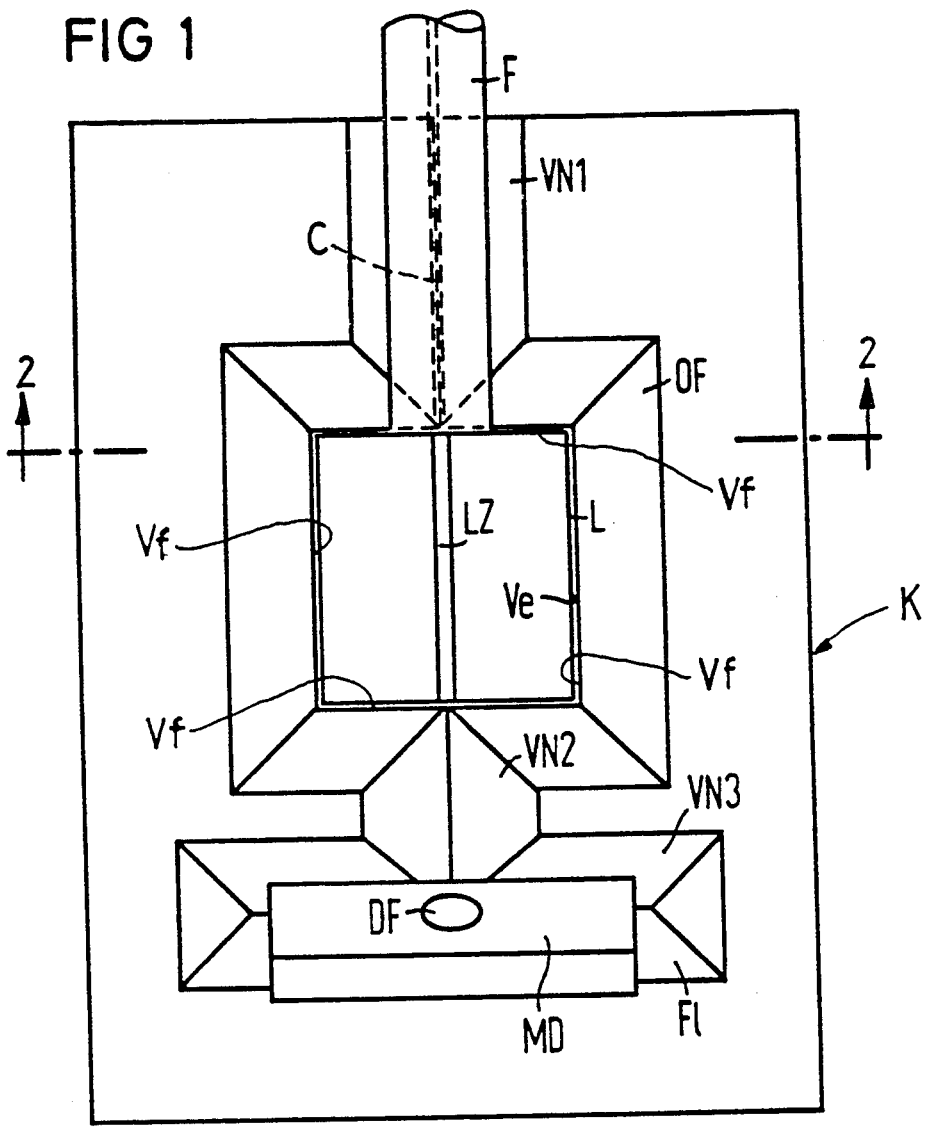
FIG 1 is a plan view onto an applied example.
Figure 2:
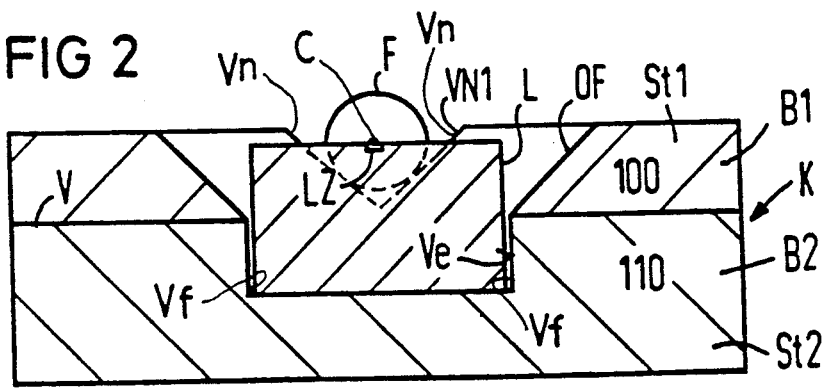
FIG. 2 is a cross section through the example of FIG. 1 generally along the section line 2—2.

In an applied example shown in the figures, a laser chip L having lateral light exit, an optical fiber F, for example a monomode fiber having a core C, coupled to the laser-active zone LZ of this laser chip L, and a monitor detector MD having detector window DF for monitoring and/or regulating the output power of the chip L are secured on an inventive member K of crystalline silicon.

The member K is composed, for example, of an upper wafer St1 of single-crystal silicon having the crystal orientation (100) and of a lower wafer St2 of single-crystal silicon having the crystal orientation (110) that have their flat sides connected to one another by a connection V. The connection V can be produced by various methods including:

joining the upper wafer St1 and the lower wafer St2 by tempering at temperatures above 1000° C.;

joining together via SiO$_2$ by tempering at temperatures above 1000° C.;

joining together by a silicon-compatible glass solder;

joining together by a silicon-compatible solder that is composed of phosphorous-doped SiO$_2$;

joining together with a metal solder technique such as with a silicon-metal eutectic; and joining together using a silicon-metal eutectic wherein gold is employed for the eutectic.

The wafers St1 and St2 define the regions B1 and, respectively, B2 of single-crystal silicon of the inventive member K that comprise mutually different crystal orientations for anisotropic etching.

The fiber F is secured in a channel VN1 having a V-shaped profile with slanted channel sidewalls Vn that had been produced in the upper wafer St1 by anisotropic etching of the (100)-silicon material. The fiber F is thereby adjusted in transverse direction through the channel VN1 in the region of its eccentricity tolerances (3-sigma value of around 0.5 μm) or, respectively, of its diameter tolerances (3-sigma value of 1.5 through 1 μm) given monomode fibers having a core diameter of 5 through 10 μm.

The laser chip L is positioned in longitudinal direction by the position of the fiber F and is positioned in transverse direction and in a depth of a depression Ve having depression side walls Vf which are shown in the figures as vertical walls in the lower wafer St2 of the (110)-silicon material and which define a perimeter of the depression Ve. The depression Ve is produced by anisotropic etching in that a window or trough OF having an edge defined by slanting side walls is first produced in the upper wafer St1 and that part of the lower wafer St2 lying exposed in the window OF is then etched in depth.

The monitor detector MD in the form of a chip is advantageously mounted on a side wall F1 of a third channel VN3 having V-shaped profile that proceeds in transverse direction of the laser chip L, VN3 having been produced in the upper wafer St1 by anisotropic etching.

A further channel VN2 having a V-shaped profile produced in the same way in the upper wafer St1 connects the window OF with the channel VN3 and assures that light emitted by the laser chip L in the direction of the detector MD proceeds onto the detector window DF thereof.

A member of the invention can also be fashioned to be employed for other jobs of microstructure technology in silicon such as, for example, sensors. Members having more then two crystal orientations and crystals obliquely oriented can thereby also be utilized.

Etching stop layers such as, for example, doping discontinuities can also be advantageously fashioned at a desired location in such a member, these thus being included among the design possibilities.

Although the present invention has been described with reference to a specific embodiment, those of skill in the art will recognize that changes may be made thereto without departing from the scope and spirit of the invention as set forth in the appended claims.

I claim as my invention:

1. A member of crystalline silicon, comprising:
   two wafers of single-crystal silicon of different crystal orientations joined together in a connection area, a first wafer of said wafers having a V-shaped trench for fixation of an optical fiber, a second wafer of said wafers having a depression having boundry planes being oriented orthogonically to one another and to said connection area for reception of an opto-electronic device;
   said crystal orientations being chosen so that boundry planes of said V-shaped trench are oriented conformably to said crystal orientation in said first wafer and thus being adapted to production by anisotropic etching, and said boundry planes of said depression are oriented conformably to said crystal orientation in said second wafer and thus being adapted to production by anisotropic etching.

2. A member according to claim 1, wherein said window comprises a trough formed with inwardly slanting walls etched through said first wafer.

3. A member according to claim 2, wherein said slanting side walls of said trough conform to said crystal orientation in said first wafer.

4. A member according to claim 1, wherein said V-shaped channel terminates with an open end at said window.

5. A member according to claim 1, wherein said first wafer has a (100) crystal orientation and said second wafer has a (110) crystal orientation.

6. A member according to claim 1, wherein said depression is arranged to hold a rectangular chip of a compound semiconductor light coupled to said optical fiber.

7. An opto-electric connection arrangement, comprising:
   two wafers of single-crystal silicon of different crystal orientations joined together in a connection plane, a first wafer of said wafers having a V-shaped channel, a second wafer of said wafers having a depression having side walls defining a perimeter of said depression being oriented orthogonally to said connection plane;
   said first wafer having a trough having slating side walls etched through said first wafer and arranged open into said depression, said V-shaped channel opening into said trough;
   said crystal orientations being chosen so that slanting side walls of said V-shaped channel and slanting side walls of said trough are oriented according to can anisotropic etching of said first wafer, and said perimeter defining walls of said depression are oriented according to an anisotropic etching of said second wafer;
   an optical fiber arranged lengthwise of said V-shaped channel, partially residing in said V-shaped channel;
   a rectangular chip of a compound semiconductor residing in said depression and said chip having one zone selected from the group consisting of a light emitting zone and a light receiving zone, said optical fiber providing a core light coupled to said zone.

8. The arrangement according to claim 7, wherein said rectangular chip comprises a laser chip and said zone is a laser-active zone of said laser chip.

9. The arrangement according to claim 8, wherein said first wafer further comprises a further channel arranged on a side of said depression opposite said V-shaped channel, said further channel terminating with an open end at said depression, and a third channel intersecting said further channel and arranged a distance from said depression; and
   a monitor detector having a detector window for monitoring the output power of said chip, said monitor detector mounted in said third channel with said detector window facing into said further channel, said further channel arranged aligned with said laser-active zone to permit light to proceed onto the detector window.

10. The arrangement of claim 7, wherein said wafer has a (100) crystal orientation and said second wafer has a (110) crystal orientation.

* * * * *